United States Patent
Carter, Jr. et al.

[11] Patent Number: 5,594,234
[45] Date of Patent: Jan. 14, 1997

[54] DOWNSET EXPOSED DIE MOUNT PAD LEADFRAME AND PACKAGE

[75] Inventors: Buford H. Carter, Jr., Richardson; Dennis D. Davis, Garland; David R. Kee, Richardson; Jesse Clark, Farmers Branch; Steven P. Laverde, Dallas; Hai Tran, Cedarhill, all of Tex.

[73] Assignee: Texas Instruments Incorporated, Dallas, Tex.

[21] Appl. No.: 337,798

[22] Filed: Nov. 14, 1994

[51] Int. Cl.$^6$ .................................. H01L 23/495
[52] U.S. Cl. ........................... 257/676; 257/666
[58] Field of Search ..................... 257/666, 676, 257/787

[56] References Cited

U.S. PATENT DOCUMENTS

| | | | |
|---|---|---|---|
| 4,714,952 | 12/1987 | Takekawa et al. | 257/676 |
| 5,252,783 | 10/1993 | Baird | 257/670 |
| 5,428,248 | 6/1995 | Cha | 257/676 |
| 5,436,500 | 7/1995 | Park et al. | 253/675 |
| 5,440,170 | 8/1995 | Tsuji et al. | 257/676 |

FOREIGN PATENT DOCUMENTS

| | | | |
|---|---|---|---|
| 1-66959 | 3/1989 | Japan | 257/676 |

*Primary Examiner*—Mahshid Saadat
*Assistant Examiner*—S. V. Clark
*Attorney, Agent, or Firm*—Robby Holland; Leo Heiting; Richard Donaldson

[57] ABSTRACT

The invention is a single piece deep downset exposed lead frame (10) that can be used in current production processes. A single lead frame (10) has a die mount pad (12) that is formed with a downset or cavity into which the semiconductor die (20) is mounted. Wings (14, 15, 17, 18) lock the die pad in the device package (21) and increase the length of potential moisture paths (34a). The downset die pad (12) provides direct thermal contact of the die mount pad (12) to an external heat sink, eliminating the need for a heat slug internal to the package. The exposed die pad (12) can also be used as an RF ground connection to an RF circuit ground plane.

12 Claims, 7 Drawing Sheets

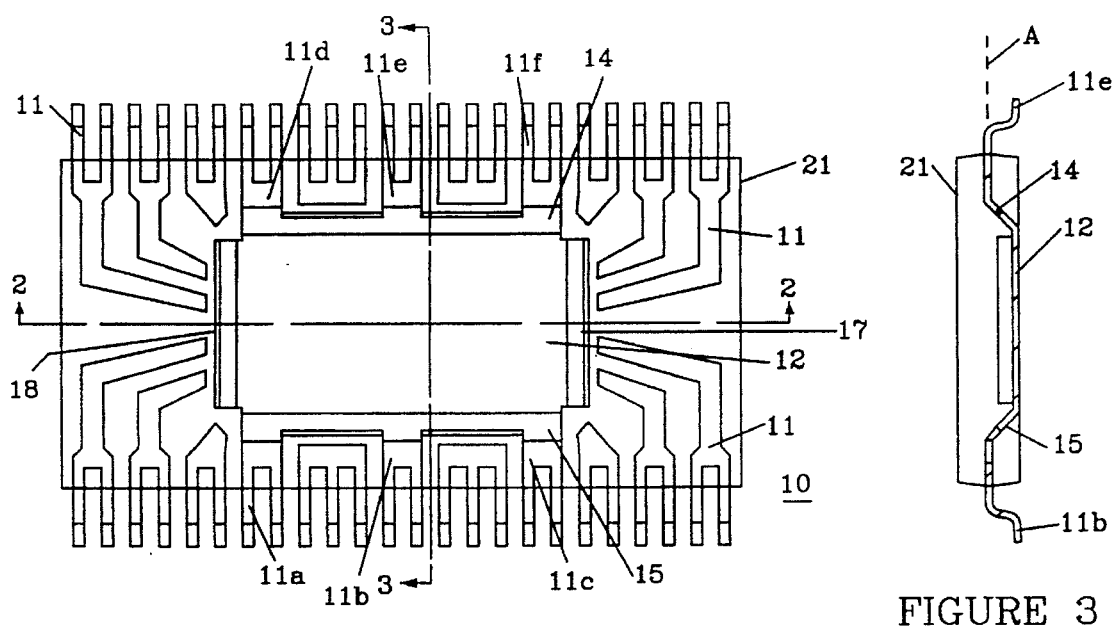
FIGURE 1
FIGURE 3
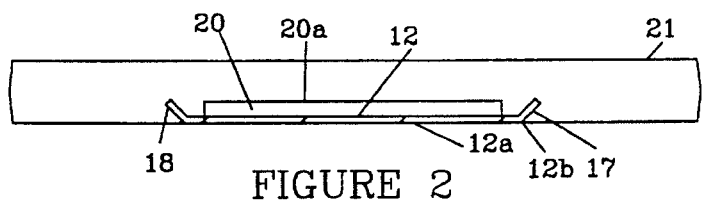
FIGURE 2

DOWNSET EXPOSED DIE MOUNT PAD LEADFRAME AND PACKAGE

FIELD OF THE INVENTION

This invention relates to semiconductor devices and the packaging of semiconductor devices, and more particularly to a lead frame having a downset semiconductor die mount pad exposed at one face of the package.

BACKGROUND OF THE INVENTION

Power semiconductor devices and other transistor and integrated circuit devices that dissipate high power, or are used in high frequency telecommunications, generally are packaged with a heat sink (or heat slug) to dissipate heat produced by the device, and to provide RF ground for the device. The heat slug is positioned close to or against the semiconductor device and encapsulated within the device package with one surface of the heat slug exposed through the package encapsulant. The addition of the heat slug along with the lead frame requires additional assembly steps, additional equipment, and adds cost to the package. Also, voids between the heat slug and device can cause package problems and device malfunctions. Large low profile packages require "dry packing" to insure that "popcorn cracks" do not occur during device-to-PWB (Printed Wiring Board) soldering. "Popcorn cracks" are generally caused by rapid heating and resulting expansion of moisture between the large die pad and the thin bottom plastic of the device package.

The use of heat slugs in a package consumes a large portion of the total internal height of the package which prevents this approach from being used in low profile packages. Low profile packages are often required in equipment such as disk drives, notebook computers, cellular phones, PCMCIA cards, personal digital assistants and portable consumer electronics.

SUMMARY OF THE INVENTION

The invention relates to a leadframe for use with semiconductor devices. The leadframe includes a plurality of leadframe leads in a first horizontal plane and a die mount pad downset from said first plane to a second plane so that a portion of said down set die mount pad extends to and through said encapsulating package.

In making the leadframe, the lead frame is formed including the lead frame leads and a die mount pad. The die mount pad is downset to a plane below and horizontal to a plane of the leadframe leads, and wings on said die mount pad are formed to extend outward and upward from the plane of the die mount pad.

The technical advance represented by the invention, as well as the objects thereof, will become apparent from the following description of a preferred embodiment of the invention when considered in conjunction with the accompanying drawings, and the novel features set forth in the appended claims.

BRIEF DESCRIPTION OF THE DRAWINGS

FIG. 1 is a top view of a downset die pad leadframe according to a first embodiment of the invention;

FIG. 2 is a sectional side view of the leadframe of FIG. 1;

FIG. 3 is a sectional end view of the leadframe of FIG. 1;

DESCRIPTION OF A PREFERRED EMBODIMENT

Figure 4:
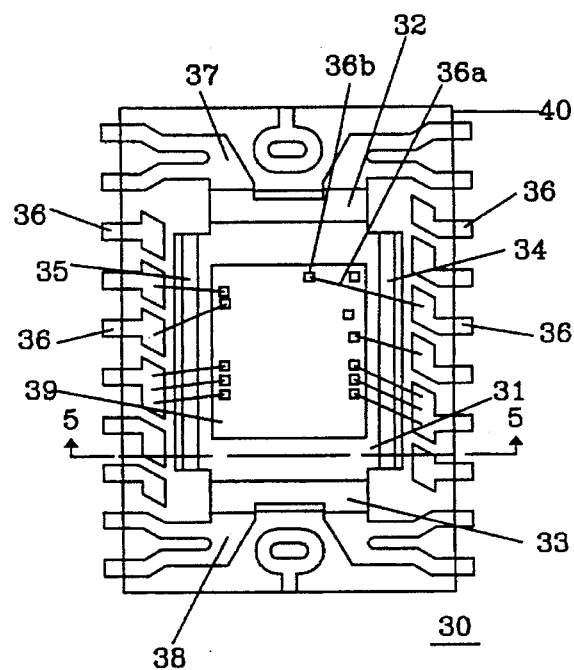
FIG. 4 is a top view of a downset die pad leadframe according to a second embodiment of the invention.

The invention, as described in FIGS. 1–14, relates to a single piece deep downset exposed lead frame that can be used in current production processes and installed equipment base. A single lead frame has a die mount pad that is formed with a downset or cavity into which the semiconductor die is mounted. This provides direct contact of the die mount pad to an external heat dissipator and thermal plane, eliminating the internal heat slug. By mounting the semiconductor die into the downset mounting pad, a standard thickness die can be used and still provide a thin package.

Other advantages include, the use of up-hill bonding, larger diameter bond wires, an electrically conductive exposed RF ground plane, a reduction in package height, and elimination of the thin layer of bottom plastic, removing the susceptibility of the bottom plastic to form popcorn cracks.

The lead frame is formed, usually in a matrix of leadframes, with the lead frame leads in one plane and the lead frame die mount pad formed on another lower plane. The edges of the mount pad are formed upward to provide moisture ingress protection, to provide die mount pad mechanical rigidity, and to provide mold locking of plastic to the leadframe.

FIG. 1 is a top view of a downset die pad leadframe 10 having a die mounting pad 12 which has been downset below the plane A (FIG. 3) of the leads 11. Die pad 12 has, in the embodiment of FIG. 1, sides 17 and 18, on opposite ends of the die pad, that extend upward and outward toward the lead frame leads 11. Sides 17 and 18 are hereinafter referred to as wings. Die pad 12 also has wings 14 and 15 which extend upward and outward from the die pad 12 and are connected with or adjacent to the leadframe leads 11. As illustrated, lead frame leads generally designated as 11a, 11b, 11c, 11d, 11e, and 11f are connected to the wings 14 and 15 respectively. The other leadframe leads 11 are not attached to die pad 12 since they will be used to make isolated wire bond connections to the semiconductor die surface 20a (FIG. 2) mounted on die pad 12. Leadframe leads 11a–11f may be used to provide ground connections and to hold the die pad in place. Package 21 is shown in outline.

FIG. 2 is a cross-sectional view taken through section 2—2 of FIG. 1. The wings 18 and 17 of die pad 12 are shown extending outward and upward from the plane of die pad 12. An outline of a semiconductor die 20 is illustrated, showing that the top 20a of die 20, in some embodiments, may be below the top edges of wings 17 and 18. Bottom 12a of die pad 12 is exposed at the surface of package 21, providing a good thermal connection point for heat transfer from die pad 12 to the outside of package 21. The wings 17 and 18, as well as wings 14 and 15 increase the moisture path (discussed below with reference to FIG. 5a) from the external die-pad/plastic interface 12b to the semiconductor die, and also may provide R.F. shielding for high frequency semiconductor devices.

FIG. 3 is a cross-sectional view taken through section 3—3 of FIG. 1. The die pad wings 14 and 15 extend upward and outward extending the moisture path from the die external pad/plastic package interface. Leadframe leads 11e and 11b are shown connected to the die pad wings at 14 and 15, respectively.

FIG. 4 is another embodiment of a downset lead frame. Leadframe 30 has a downset die pad 31 with a plurality of leadframe leads 36 on two sides. Die pad 31 has wings 34 and 35 extending outward and upward from the plane of die pad 31 on two sides, and wings 32 and 33 extend outward and upward from die pad 31 on two ends. The lead frame leads 36 are along side of die pad 31. The end leads 37 and 38 are connected to die pad 31 and are for ground connections. A semiconductor die 39 is shown mounted on die pad 31 with various contact pads connected to lead frame leads 36, for example wire bond 36a is connected to bond pad 36b. The overall package outline is shown at 40.

Figure 5:
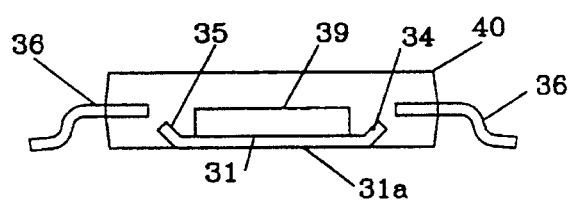
FIG. 5 is a sectional end view of the leadframe of FIG. 4.

FIG. 5 is sectional end view, through section 5—5, of the leadframe and package of FIG. 4. Die pad 31 is shown with wings 34 and 35 extending upward and outward. Wings 34 and 35 help lock the leadframe in the plastic package 40, which is shown in outline. Leadframe leads 36 are shown extending adjacent to die 39 and through package 40. Surface 31a of die pad 31 is shown at one surface of the package providing a thermal path for the package.

Figure 5A:
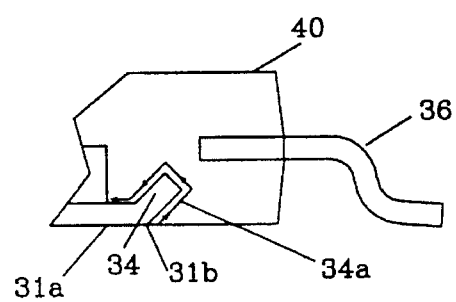
FIG. 5a shows a design feature to restrict moisture intrusion.

FIG. 5a shows a restricted external moisture path 34a that extends around the wings, for example wing 34. Wing 34 extends the potential moisture path which begins at package plastic/mount pad interface 31b.

Figure 6:
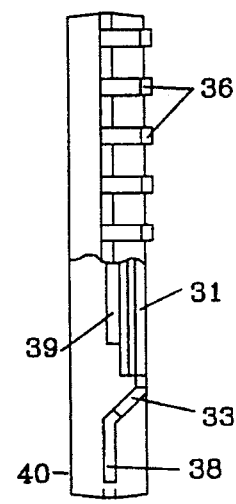
FIG. 6 is a side view of the leadframe of FIG. 4.

FIG. 6 is a cutaway side view of the leadframe and package of FIG. 4 showing the exterior and interior of package 40. Lead fingers 38 are shown connected to wings 33. Die 39 is mounted in the downset die pad 31. Leads 36 extend out of package 40 and are shaped to provide for surface mounting of the device.

Figure 7:
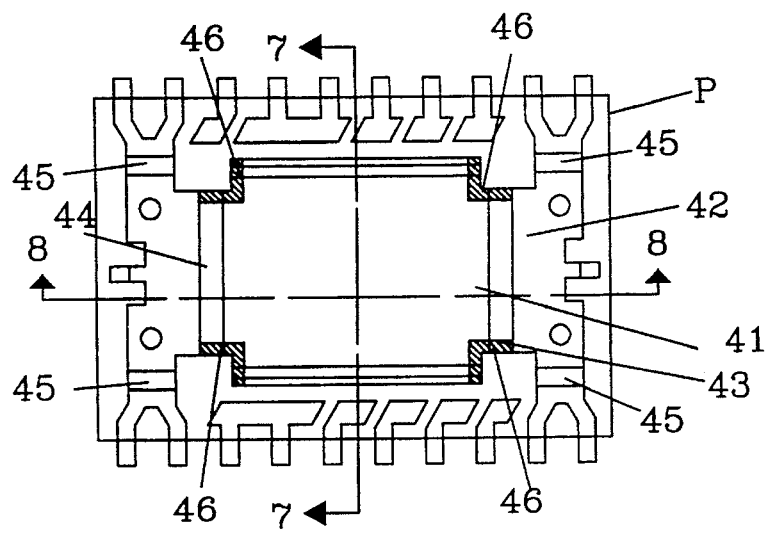
FIG. 7 is a top view of a downset leadframe/die pad according to a third embodiment of the invention having a multi-step downset.

FIG. 7 is a top view of downset die pad 41 showing a multi-step down-setting approach for achieving a deep downset. The first step occurs at 44 and the second step at 45. The package out line is designated P.

Figure 7A:
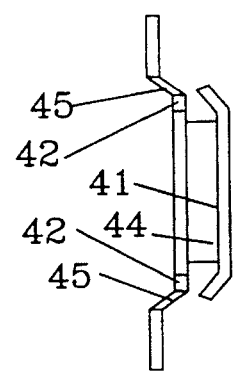
FIG. 7a is a sectional end view of the die pad of FIG. 7.
Figure 8:
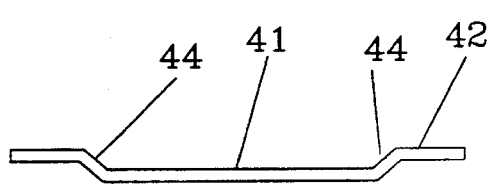
FIG. 8 is a partial side view of the central downset portion of the downset die pad.

FIG. 7a is a cross-sectional view through section 7—7 of the downset leadframe of FIG. 7, and FIG. 8 is a partial side view, through section 8—8, showing the central downset die pad. The structure of downset 45 and related parts are not illustrated in FIG. 8. For clarity of illustration, only the additional downset at 41, 44 and 42 is shown. The first downset 44 is set to match standard leadframes and standard die thicknesses. Down set 45 is set to transition the distance necessary to expose the die mount pad at the bottom face of the package. The two downsets, 44, 45, are 90° to each other, and provide the force to hold the die mount pad 41 against the bottom of the cavity mold during package molding. Leadframe level 42 can be used for making optional wire bond ground connections to the semiconductor die (not illustrated).

Figure 7B:
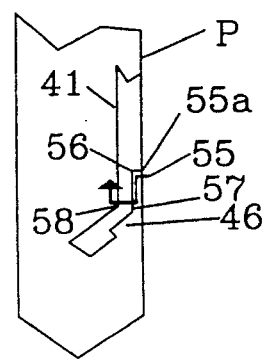
FIG. 7b shows a design feature to restrict moisture intrusion.

Corners 46 are formed by stamping, etching, or similar process to restrict moisture penetration by increasing the moisture path and introducing three 90° turns or corners. These corners are shown in more detail in FIG. 7b. Corners 56, 57, and 58 increase the moisture path to deter moisture intrusion into the package. The outline P of a package is shown with die pad 41 exposed at the surface. The die pad/plastic interface is shown at 55a. A increased length moisture path 55 is shown by the arrow, showing the corners 56, 57 and 58.

Figure 9:
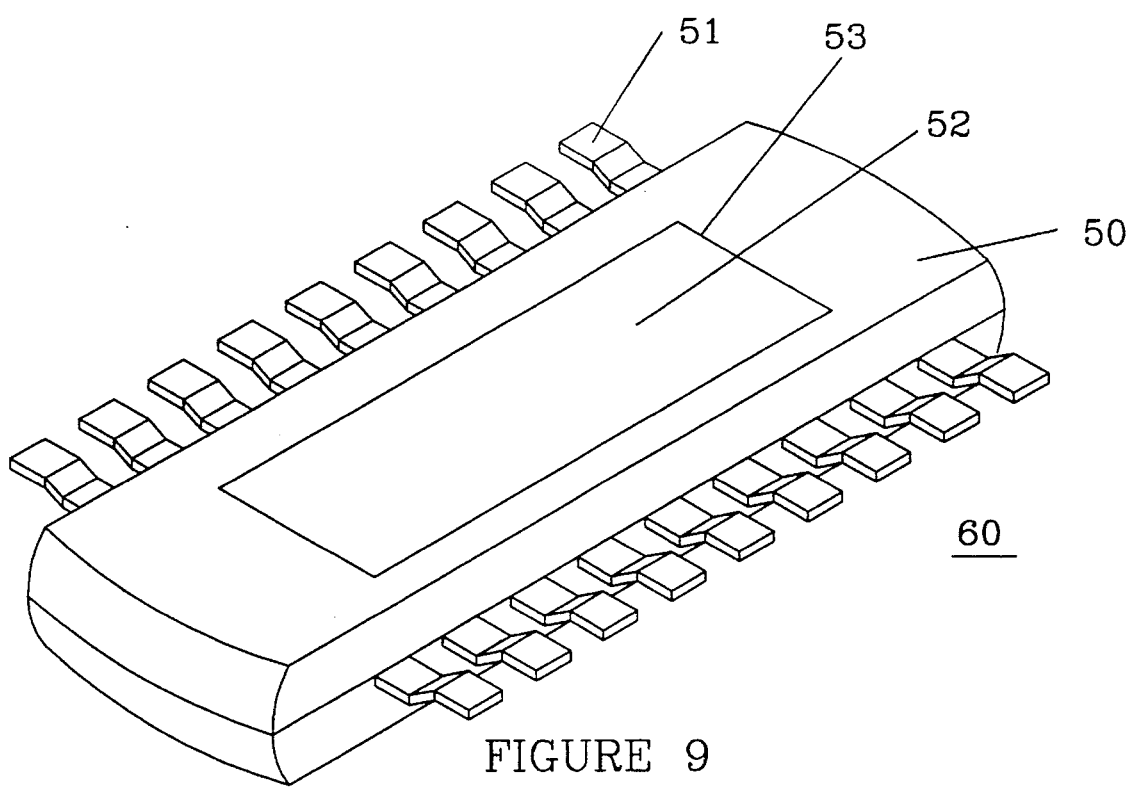
FIG. 9 shows the thermally and electrically conductive exposed die mount pad on the bottom surface of a package.

FIG. 9 shows a semiconductor package with the downset die pad 52 exposed at the surface 50 of the package. Package 60 with leads 51 has the bottom surface 52 of the downset die pad exposed at the surface 50 of the bottom of the package 60. Package 60 can be mounted with the bottom surface 52 mounted to a heat sink surface. Die pad/package interface 53 is generally a metal to plastic interface. The exposed die pad to heat sink interface (not illustrated) can be accomplished using standard surface mount solder techniques, or use of a thermally conductive compound. An air gap between the exposed pad 52 and the heat sink will eliminate the incremental thermal performance.

Figure 10A:
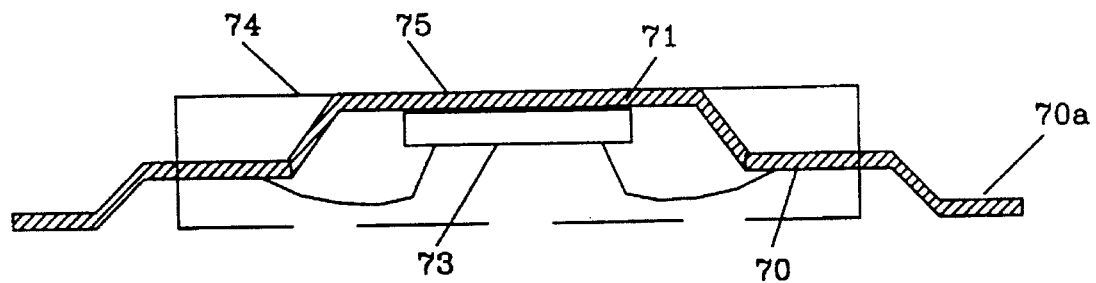
FIG. 10a shows a fourth embodiment of the invention with a downset thermal die pad with leads formed to place the die pad on top of package.
Figure 10B:
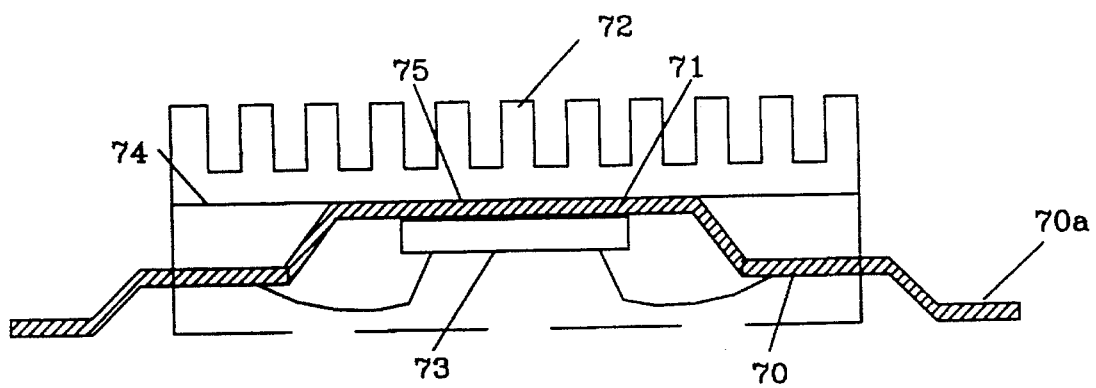
FIGS. 10b and 10c show the embodiment of FIG. 10a with heat dissipators in contact with the downset thermal die pad.

FIG. 10a shows a fourth embodiment of the invention with a downset die pad with leads 70a formed to place the die pad at the top of the device. Down set leadframe 70 has a downset (or as illustrated, an up-set) die pad 71. The package outline is shown at 74, with the bottom 75 of die pad 71 extending through package 74. FIG. 10b shows the package of FIG. 10a with a heat sink 72 mounted on top of the package. With the heat sink on the top of the package, the heat generated by the device can be dissipated and carried away with normal ventilation or air flow ventilation produced by a fan.

Figure 10C:
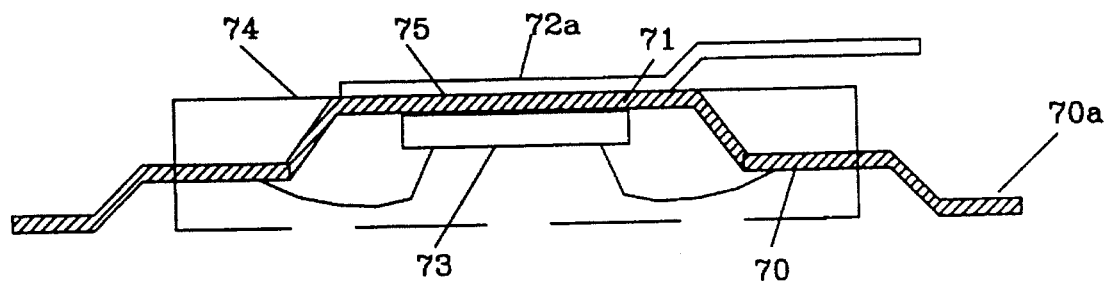

FIG. 10c shows the device of 10a with a thermal dissipating clip or finger in contact with and extend across the top of the package in contact with the exposed surface 73 of the thermal die pad.

Figure 11:
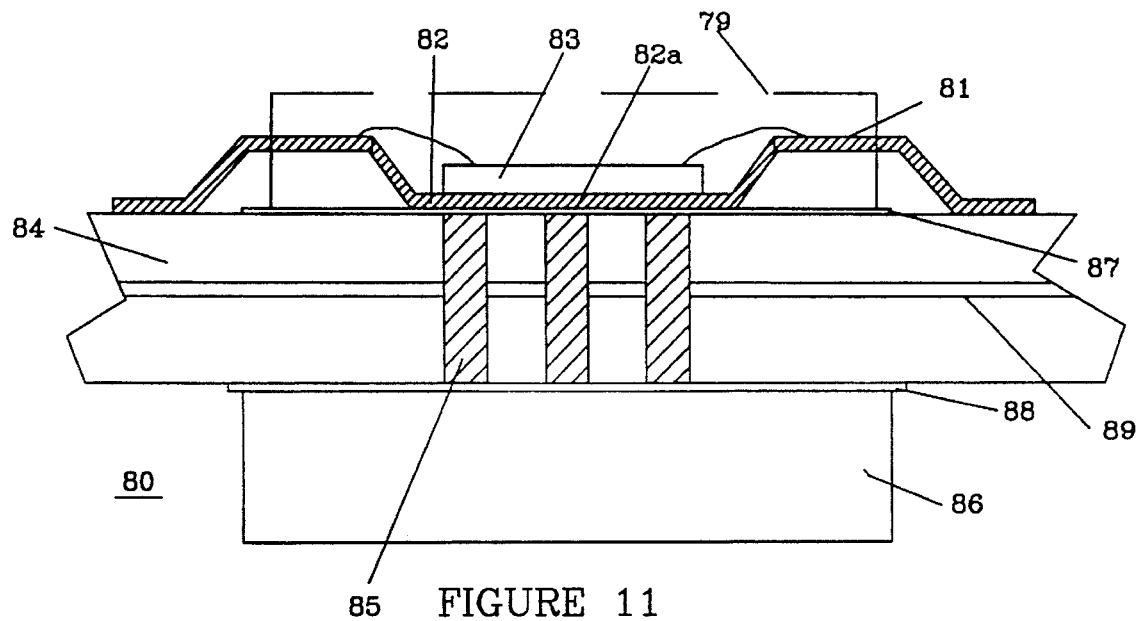
FIG. 11 shows the combination of a down set die pad device and a printed wiring board with thermal conductive vias through the printed wiring board to a heat sink.

FIG. 11 illustrates the combination 80 of a down set die pad device and a printed wiring board with thermal conductive vias through the printed wiring board to a heat sink. Downset leadframe 81 has a die pad 82 with semiconductor die 83 mounted thereon. The semiconductor device package is shown in outline at 79. Die mount pad 82 has face 82a extending through package 79. Package 79 is mounted on printed wiring board 84 with face 82a of die pad 82 mounted over and in thermal contact with a plurality of heat conductive vias 85. To ensure a good thermal contact, a thermal conductive material, such as grease, epoxy or solder 87, is placed between die pad face 82a and the ends of vias 85. An optional ground plane 89 is shown extending through printed circuit board 84.

Mounted under and in thermal contact with vias 85 is a heat sink 86. Thermal grease 88 is placed between printed wiring board 84 and heat sink 86 to ensure good thermal contact between the vias 85 and heat sink 86. The configuration of FIG. 11 provides a large exposed thermal conductive area to the external heat sink 86 to ensure adequate heat transfer without having to have an internal heat slug in package 79.

Figure 12:
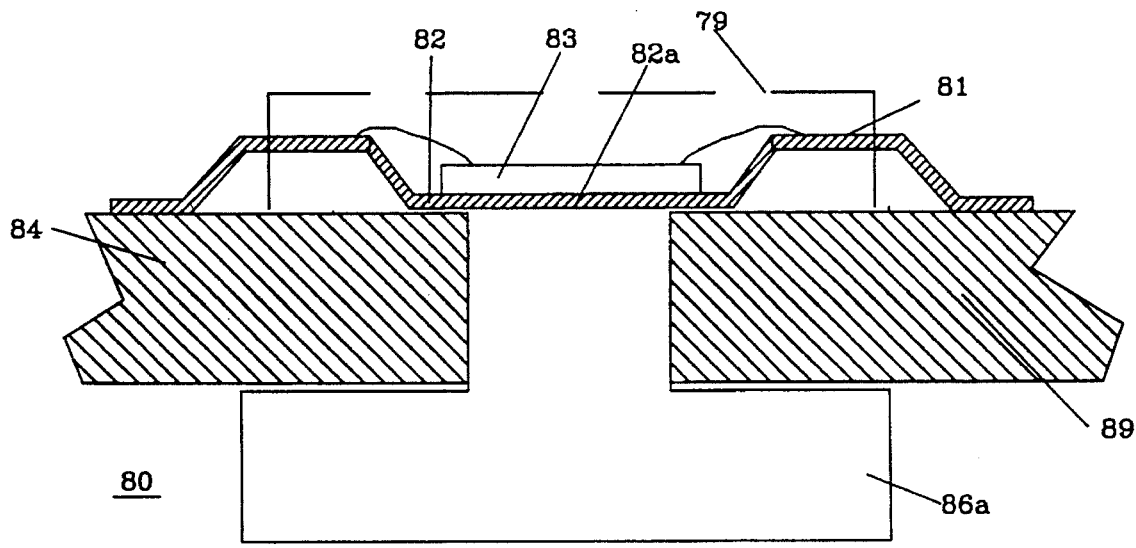
FIG. 12 shows another embodiment of FIG. 11, with a heat sink extending through the printed wiring board directly in contact with the downset thermal die pad.

FIG. 12 is a device and printed board combination as shown in FIG. 11, but in this embodiment, a solid heat dissipator 86a extends through printed circuit board 84 and is in direct contact with the face 82a of exposed die pad 82. The heat dissipator 86a provides a more effective thermal path than the vias 85, and does not use up valuable printed circuit board space.

Figure 13:
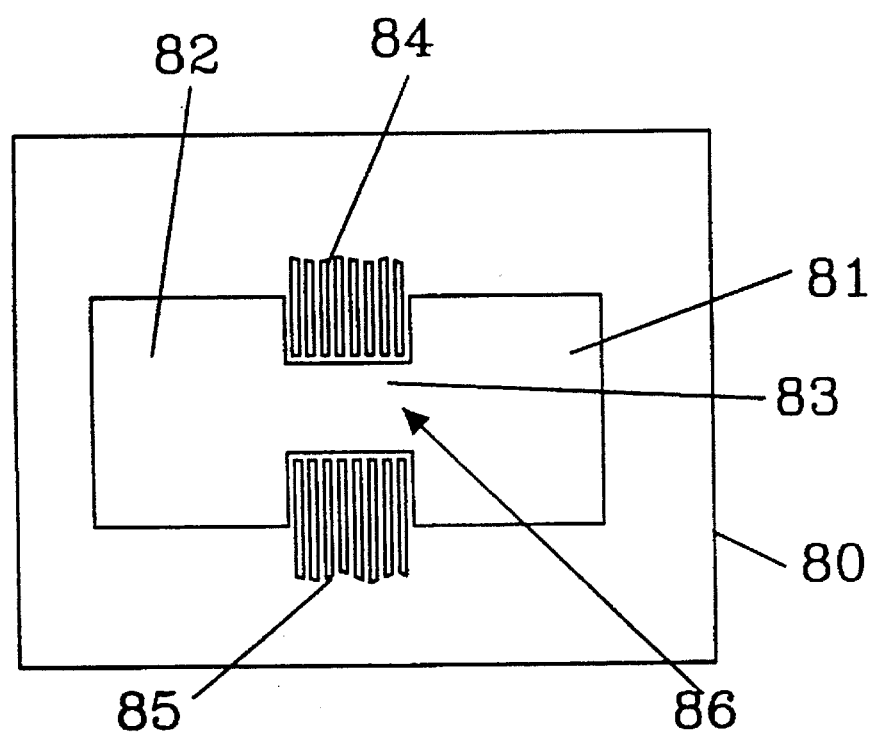
FIG. 13 shows a printed wiring board with a large thermal conductive pad on each side of the semiconductor mounting area, and a thermal conductive pad extending over the device mounting area connecting the two larger areas.

FIG. 13 shows a printed wiring board 80 with large thermal conductive pads 81 and 82 on each side of the semiconductor mounting area 86, and a thermal conductive pad 83 extending over the device mounting area 86 connecting the two larger areas. Printed circuit wiring board conductors 84 and 85 are shown adjacent the mounting area 86.

Figure 14:
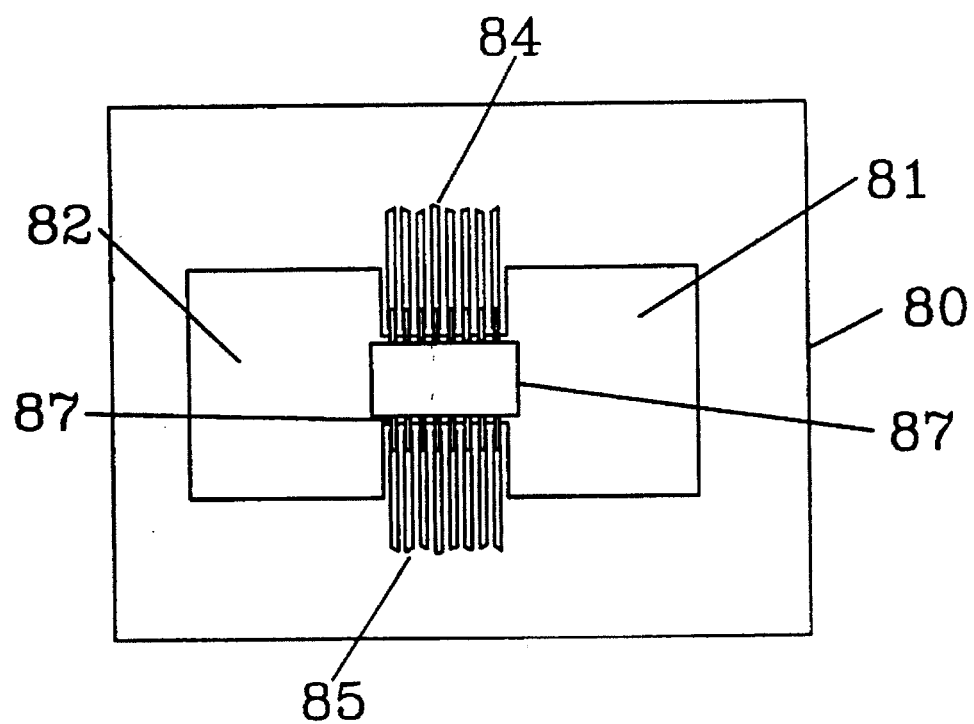
FIG. 14 shows the printed wiring board of FIG. 13 with a device mounted to the printed wiring board.

FIG. 14 is the printed wiring board 80 of FIG. 13 with a down set leadframe device 87 mounted with the downset thermal die pad mounted in contact with thermal conductive pad 83 and device leads 87 connected to printed wiring board conductors 84 and 85. The large area thermal conductive areas 81 and 82 provide large surface areas for the dissipation of heat generated by device 87.

What is claimed:

1. A leadframe for use with semiconductor devices, comprising:

a plurality of leadframe leads in a first horizontal plane; a die mount pad downset from said first plane to a second plane, the die mount pad downset includes a base, and a plurality of notched wings extending upward from said base.

2. The leadframe according to claim 1, where in at least some of said leadframe leads are attached to said downset die mount pad.

3. The leadframe according to claim 1, wherein said downset is a multi-step downset.

4. A leadframe for use with semiconductor devices, comprising:

a plurality of leadframe leads in a first horizontal plane;

a die mount pad including a base downset from said first plane to a second plane, and having a plurality of notched wings extending outward and upward from said base; and at least one leadframe lead attached to the downset die pad.

5. A semiconductor device, including a semiconductor die, a leadframe and a plastic encapsulating body, comprising:

a plurality of leadframe leads in a first horizontal plane;

a die mount pad downset from said first plane to a second plane having a plurality of stepped corners;

a semiconductor die mounted on said downset die mount pad; and an encapsulating package encapsulating a portion of the leadframe leads, the semiconductor die, and a portion of said down set die mount pad, said downset die pad extending to and through said encapsulating package.

6. The semiconductor device according to claim 5, wherein said downset die mount pad provides a direct heat path to said semiconductor die.

7. The semiconductor device according to claim 5, wherein said downset die mount pad serves as a heat convection surface for said semiconductor die.

8. The semiconductor device according to claim 5, wherein the lead frame leads are formed to place the die pad extending through the top side of the semiconductor device package when the package is mounted on a printed wiring board.

9. The semiconductor device according to claim 5, in combination with a printed circuit board, and a heat dissipating device in contact with the exposed die pad on the top of the package.

10. The combination of a semiconductor device and printed wiring board, comprising;

a packaged semiconductor device having a first surface, including a downset die mount pad extending to and through said first surface of the semiconductor package, the downset die mount pad having a plurality of stepped corners;

a printed wiring board having first and second surfaces, and at least one heat conductive via extending through the printed wiring board between the first and second surfaces; and a heat sink in thermal contact with said heat conductive via;

said packaged semiconductor device mounted on said first surface of said printed wiring board with the downset die mount pad extending through said first surface in thermal contact with the heat conductive via on said first surface of said printed circuit board.

11. The combination according to claim 10, including a thermally conductive material between said downset die pad and said first surface of said printed circuit board, and a thermally conductive material between said heat sink and the second surface of said printed wiring board.

12. The combination of a semiconductor device and printed wiring board, comprising;

a printed wiring board having first and second thermally conductive areas on one surface thereof;

a third thermally conductive area between and connecting said first and second thermally conductive areas, a semiconductor device, mounted of said printed wiring board over said third thermally conductive area, having a down set thermal conductive die mount pad extending through a surface of the semiconductor package, said thermally conductive die pad in thermal conductive contact with said third thermally conductive area.

* * * * *